(12) United States Patent
Tsai

(10) Patent No.: US 10,097,192 B2
(45) Date of Patent: Oct. 9, 2018

(54) CIRCUITS FOR CURRENT RECYCLING AND RELATED METHODS

(71) Applicant: MediaTek Inc., Hsin-Chu (TW)

(72) Inventor: Jen-Huan Tsai, Hsinchu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/634,373

(22) Filed: Jun. 27, 2017

(65) Prior Publication Data

US 2018/0167077 A1 Jun. 14, 2018

Related U.S. Application Data

(60) Provisional application No. 62/432,733, filed on Dec. 12, 2016.

(51) Int. Cl.
*H03M 1/06* (2006.01)
*H03M 1/00* (2006.01)
*H03M 1/74* (2006.01)
*H03M 1/12* (2006.01)

(52) U.S. Cl.
CPC ............ *H03M 1/06* (2013.01); *H03M 1/002* (2013.01); *H03M 1/00* (2013.01); *H03M 1/12* (2013.01); *H03M 1/745* (2013.01)

(58) Field of Classification Search
CPC ........... H03M 1/00; H03M 1/12; H03M 1/745
USPC ................ 341/118, 155, 156, 120, 135, 136
See application file for complete search history.

(56) References Cited

U.S. PATENT DOCUMENTS

2007/0024485 A1 2/2007 Kumar et al.
2009/0121912 A1 5/2009 Zanchi et al.
2010/0171559 A1* 7/2010 Chou .................. H03B 5/24
                                                                331/66

OTHER PUBLICATIONS

Craninckx et al., A 65 fJ/conversion-step 0-to-50 MS/s 0-to0.7mW 9b charge-sharing SAR ADC in 90 nm digital CMOS. IEEE International Solid-State Circuits Conference, Digest of Technical Papers. 2007;13(5):3pgs.
Harikumar et al., Design of a reference voltage buffer for a 10-bit 1-MS/s SAR ADC. 2014 Proceedings of the 21st International Conference Mixed Design of Integrated Circuits and Systems (MIXDES). Lublin. 2014:185-8.
Harikumar et al., Design of a reference voltage buffer for a 10-bit 50 MS/s SAR ADC in 65 nm CMOS. 2015 IEEE International Symposium on Circuits and Systems (ISCAS). Lisbon. 2015:249-52.
Kull et al., A 35mW8 b 8.8 GS/s SAR ADC with low-power capacitive reference buffers in 32nm Digital SOI CMOS. 2013 Symposium on VLSI Circuits Digest of Technical Papers. Kyoto. 2013:C260-1.

(Continued)

*Primary Examiner* — Joseph Lauture
(74) *Attorney, Agent, or Firm* — Wolf, Greenfield & Sacks, P.C.

(57) ABSTRACT

Circuits and methods for current recycling in signal buffers for switched capacitor circuits are described. A signal buffer may be coupled to an impedance element, such as a resistor, configured to provide a desired reference voltage to the switched capacitor circuit. In some embodiments, a portion of the power absorbed by the impedance element may be recycled to power one or more additional circuit. Such additional circuit(s) may include active elements. In some embodiments, the switched capacitor circuit is part of an analog-to-digital converter. In some embodiments, the additional circuit(s) are also part of the analog-to-digital converter.

20 Claims, 7 Drawing Sheets

(56) References Cited

OTHER PUBLICATIONS

Liu, A 10-bit 320-MS/s low-cost SAR ADC for IEEE 802.11ac applications in 20-nm CMOS. 2014 IEEE Asian Solid-State Circuits Conference (A-SSCC). KaoHsiung. 2014:77-80.

Tsai et al., A 1-V-0.6-V 9-b 1.5-MS/s Reference-Free Charge-Sharing SAR ADC for Wireless-Powered Implantable Telemetry. IEEE Transactions on Circuits and Systems II: Express Briefs. Nov. 2014; 61(11):825-9.

Wan et al., A 10-bit 50-MS/s SAR ADC with techniques for relaxing the requirement on driving capability of reference voltage buffers. 2013 IEEE Asian Solid-State Circuits Conference (A-SSCC). 2013:293-6.

Extended European Search Report for Application No. EP 17183820.4 dated Feb. 9, 2018.

\* cited by examiner

CIRCUITS FOR CURRENT RECYCLING AND RELATED METHODS

RELATED APPLICATIONS

This Application claims priority under 35 U.S.C. § 119(e) to U.S. Provisional Application Ser. No. 62/432,733, entitled "Analog-to-digital converter with a reference buffer" filed on Dec. 12, 2016, which is herein incorporated by reference in its entirety.

BACKGROUND

Successive approximation analog-to-digital converters utilize digital-to-analog converters to generate reference signals. Some of these digital-to-analog converters include switched capacitor circuits.

BRIEF SUMMARY

According to one aspect of the present application, a circuit is provided. The circuit may comprise a switched capacitor circuit, a signal buffer configured to provide a reference signal to the switched capacitor circuit, a resistive impedance element coupled to the signal buffer and configured to receive a first current from the signal buffer, and an active circuit coupled to the signal buffer and configured to receive a second current from the signal buffer, the second current being configured to power, at least partially, the active circuit.

In some embodiments, the switched capacitor circuit is at least a portion of an analog-to-digital converter.

In some embodiments, the active circuit is at least a portion of the analog-to-digital converter.

In some embodiments, the analog-to-digital converter is a successive approximation analog-to-digital converter, and wherein the switched capacitor circuit is at least a portion of a digital-to-analog converter.

In some embodiments, the analog-to-digital converter is a successive approximation analog-to-digital converter, and wherein the active circuit comprises an amplifier configured to drive a digital-to-analog converter.

In some embodiments, the signal buffer is a first signal buffer, and further comprising a second signal buffer configured to drive the analog-to-digital converter during conversion of a most significant bit (MSB) and to be uncoupled from the analog-to-digital converter during conversion of a least significant bit (LSB).

In some embodiments, the circuit further comprises feedback circuitry configured to counteract fluctuations in the reference signal.

In some embodiments, the circuit further comprises a dummy load coupled to the feedback circuitry.

In some embodiments, the active circuit and the dummy load share equal process, voltage and/or temperature variations.

In some embodiments, the signal buffer is arranged in a source follower configuration.

In some embodiments, the signal buffer comprises an NMOS transistor.

In some embodiments, the resistive impedance element is coupled to a source terminal of the NMOS transistor.

In some embodiments, the switched capacitor circuit and the active circuit are coupled to a source terminal of the NMOS transistor.

In some embodiments, the active circuit comprises at least one transistor.

In some embodiments, the active circuit lacks power sources.

According to another aspect of the present application, a method is provided. The method may comprise providing a reference signal to a switched capacitor circuit using a signal buffer, and providing a first current to a resistive impedance element coupled to the signal buffer and a second current to an active circuit coupled to the signal buffer, wherein the second current powers, at least partially, the active circuit.

In some embodiments, the switched capacitor circuit is at least a portion of an analog-to-digital converter.

In some embodiments, the active circuit is at least a portion of the analog-to-digital converter.

In some embodiments, the method further comprises compensating for fluctuations in the reference signal using a feedback circuit coupled to the signal buffer.

In some embodiments, the method further comprises compensating for process, voltage and/or temperature variations occurring in the active circuit by providing an error signal using a dummy load.

The foregoing summary is provided by way of illustration and is not intended to be limiting.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION

The inventor has appreciated that certain signal buffers configured to drive switched capacitor circuits waste excessive amounts of power. In some circumstances, the major reason for this waste of power is attributable to the power absorbed by the impedance element (e.g., the resistor) that is configured to bias the signal buffer (e.g., place the signal buffer in a saturation region). One example of such a switched capacitor circuit is a successive approximation analog-to-digital converter (SAR ADC). A SAR ADC converts a continuous analog waveform into a digital representation using a binary search through the possible quantization levels.

The inventor has further appreciated that part of this wasted power may be recycled to drive another circuit element, such as a load or an amplifier. In some embodiments, recycling of the power may be performed without sacrificing the power delivered to the switched capacitor and/or without increasing the overall power consumption of the circuit.

Figure 1:
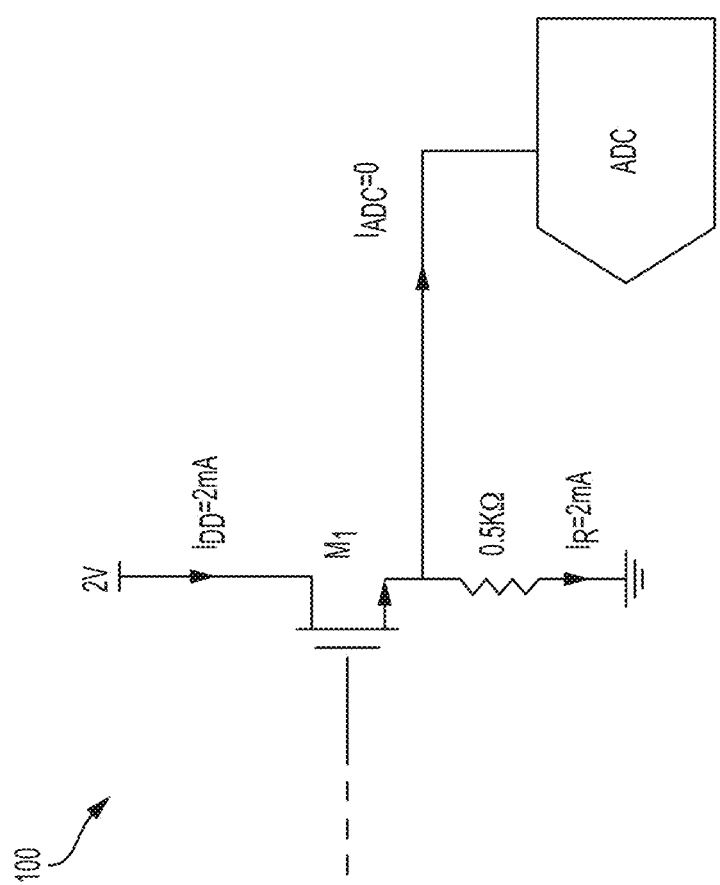
FIG. 1 is a circuit diagram illustrating a signal buffer and an analog-to-digital converter (ADC).

FIG. 1 is a circuit diagram illustrating a signal buffer and an analog-to-digital converter (ADC). The signal buffer includes transistor $M_1$ and is arranged to provide a reference voltage to the ADC. Transistor $M_1$ has a source terminal connected to a resistor having a 0.5K Ω-resistance. Transistor $M_1$ has a drain terminal connected to a supply voltage of 2V. FIG. 1 illustrates a scenario in which the ADC does not draw a current from the signal buffer. This may be the case, for example, when the switches of the ADC are temporarily open. In this circumstance, even though no current is delivered to the ADC, a current equal to 2 mA flows between the supply voltage and the ground terminal, passing through transistor $M_1$ and resistor R. As a result, the transistor absorbs 2 mW of power and the resistor absorbs 2 mW, totaling 4 mW of overall power consumption. When the ADC draws a current, for example when the switches of the ADC are closed, the resistor and the transistor continue to absorb 2 mW each. As a result, the overall power consumption of circuit 100 is greater than 4 mW.

Figure 2A:
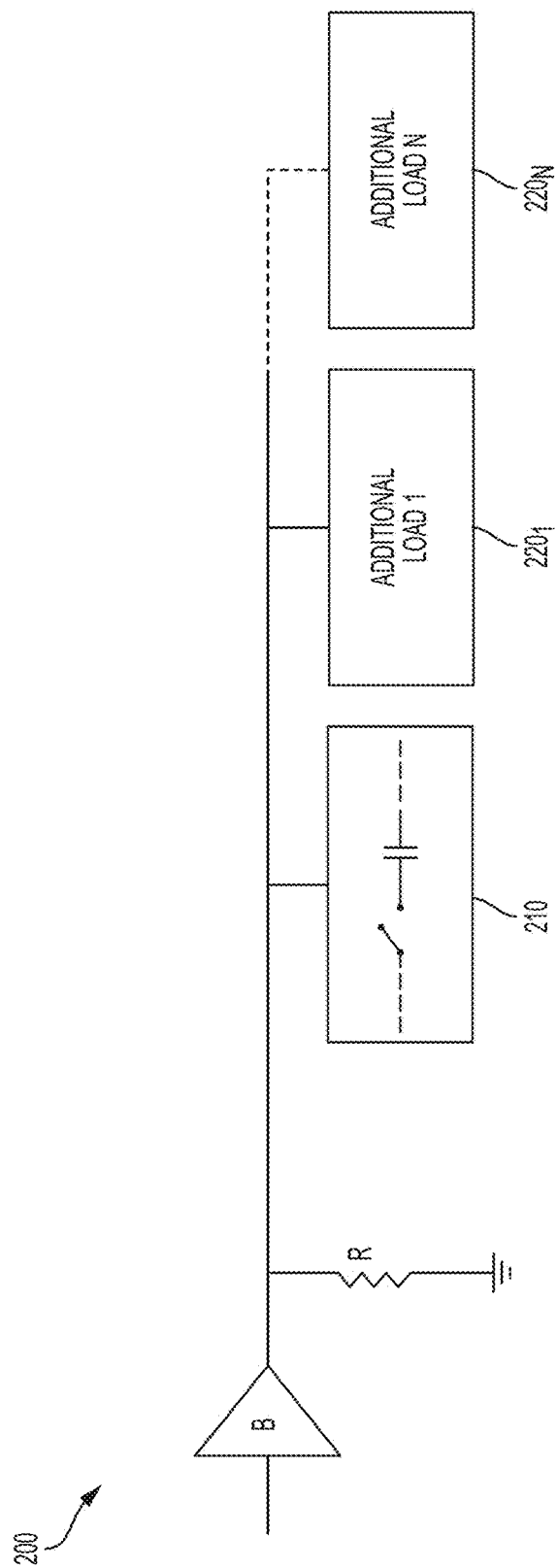
FIG. 2A is a block diagram of a circuit for current recycling, according to some non-limiting embodiments.

The inventor has appreciated that at least a portion of the power absorbed by resistor R can be reduced by reducing the bias current that flows through resistor R. Instead, the inventor has appreciated that a portion of the bias current of the signal buffer may be re-directed through an active circuit that has a useful function, as opposed to a resistor that simply dissipates energy as heat. In a sense, by redirecting the bias current to an active circuit the energy that would have been dissipated in the resistor is "recycled" to power another circuit. FIG. 2A is a block diagram illustrating a circuit arranged to redirect a portion of the current drawn by an impedance element to an additional circuit. Circuit 200 may include a signal buffer B, a resistor R, a switched capacitor circuit 210, and additional loads $220_1 \ldots 220_N$. The resistance of resistor R may be chosen to provide a desired reference voltage and/or to place signal buffer B in the linear region. Signal buffer B may be arranged such that its input impedance is greater than its output impedance. However, any other suitable type of voltage driver may be used. It should be appreciated that, in some embodiments, one or more impedance elements may be used instead of resistor R, such as a suitable combination of resistors, capacitors and inductors, or a suitable combination of active loads. Switched capacitor circuit 210 may include any suitable combination of switches and capacitive elements.

In the configuration illustrated, signal buffer B may be configured to drive current to switched capacitor 210. In some circumstances, resistor R may absorb a significant amount of power. By allowing current to flow from signal buffer B to one or more additional loads, at least a portion of the power absorbed by resistor R may be reduced and used in a more productive manner. In some embodiments, additional loads $220_1 \ldots 220_N$ may not require separate power sources, as power may be provided through signal buffer B. In other embodiments, additional loads $220_1 \ldots 220_N$ may be powered in part by signal buffer B and in part by separate power sources. In this way, circuit 200 may be more power efficient than analogous circuits in which the current drawn by resistor R is not redirected to the additional circuits $220_1 \ldots 220_N$. In some embodiments, additional loads $220_1 \ldots 220_N$ may comprise active circuits (e.g., circuits having at least one transistor). In these embodiments, the current directed to additional loads $220_1 \ldots 220_N$ may be used to power at least partially the active circuits. Examples of active circuits include, but are not limited to, signal amplifiers, power amplifiers, and signal buffers. In some embodiments, additional loads $220_1 \ldots 220_N$ include class-A circuits or a circuit with a static bias current. The class-A circuit may comprise an amplifier configured to continuously operate in an on-state (unlike other types of amplifiers such as class-B circuits). A source (or emitter) follower is an example of a class-A circuit.

Figure 2B:
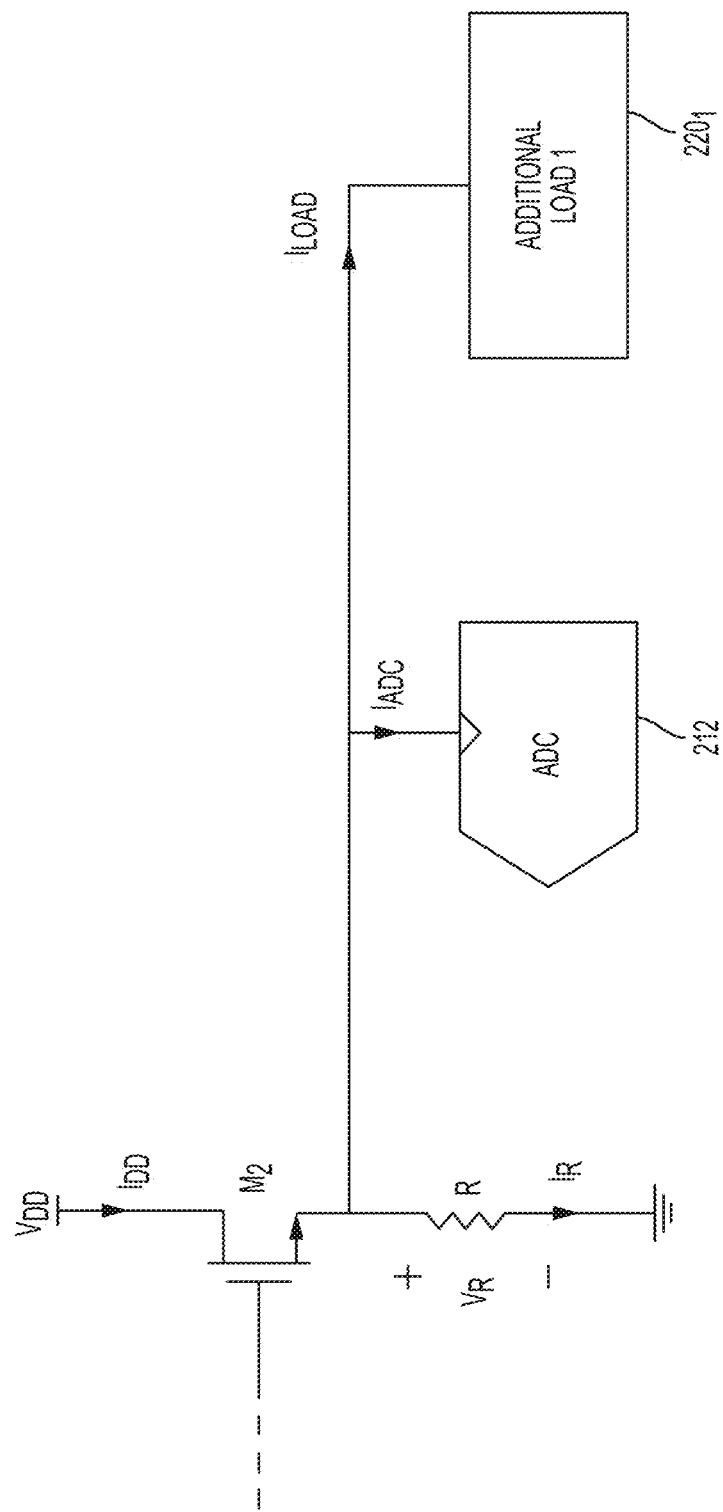
FIG. 2B is a circuit diagram of a circuit for current recycling used in connection with an ADC, according to some non-limiting embodiments.

One example of circuit 200 is illustrated in FIG. 2B, in which signal buffer B is configured to drive an analog-to-digital converter (ADC) 212. In this embodiment, signal buffer B is implemented using transistor $M_2$. Transistor $M_2$ may be any suitable type of transistor, such as a bipolar junction transistor of a field effect transistor. In the embodiments illustrated, transistor $M_2$ is an N-type metal oxide semiconductor (NMOS) transistor. Transistor $M_2$ may be arranged in any suitable way so long as its input impedance (e.g., the gate terminal's impedance) is greater than its output impedance (e.g., the source terminal's impedance). In the embodiment illustrated, transistor $M_2$ is arranged in a source-follower configuration.

The resistance of resistor R and supply voltage $V_{DD}$ may be chosen to provide a desired value for voltage $V_R$, which may be used as a reference voltage for ADC 212. For example, $V_{DD}$ may be equal to 2V and the resistance of resistor R may be 1KΩ. When ADC 212 absorbs no current, for example when its switches are open, $I_{DD}$ may be equal to 2 mA, $I_R$ may be equal to 1 mA, and $I_{LOAD}$ may be equal to 1 mA. As a result, resistor R may absorb 1 mW and additional load $220_1$ may absorb 1 mW. It should be appreciated that the circuit of FIG. 2B absorbs the same amount of power (4 mW) as the circuit of FIG. 1. However, unlike the circuit of FIG. 1, a portion of the power absorbed by resistor R is reused to power additional circuit $220_1$. During transients, for example when the switches of ADC 212 are closed, the ADC may absorb current thus increasing the overall power consumption to over 4 mW.

Figure 2C:
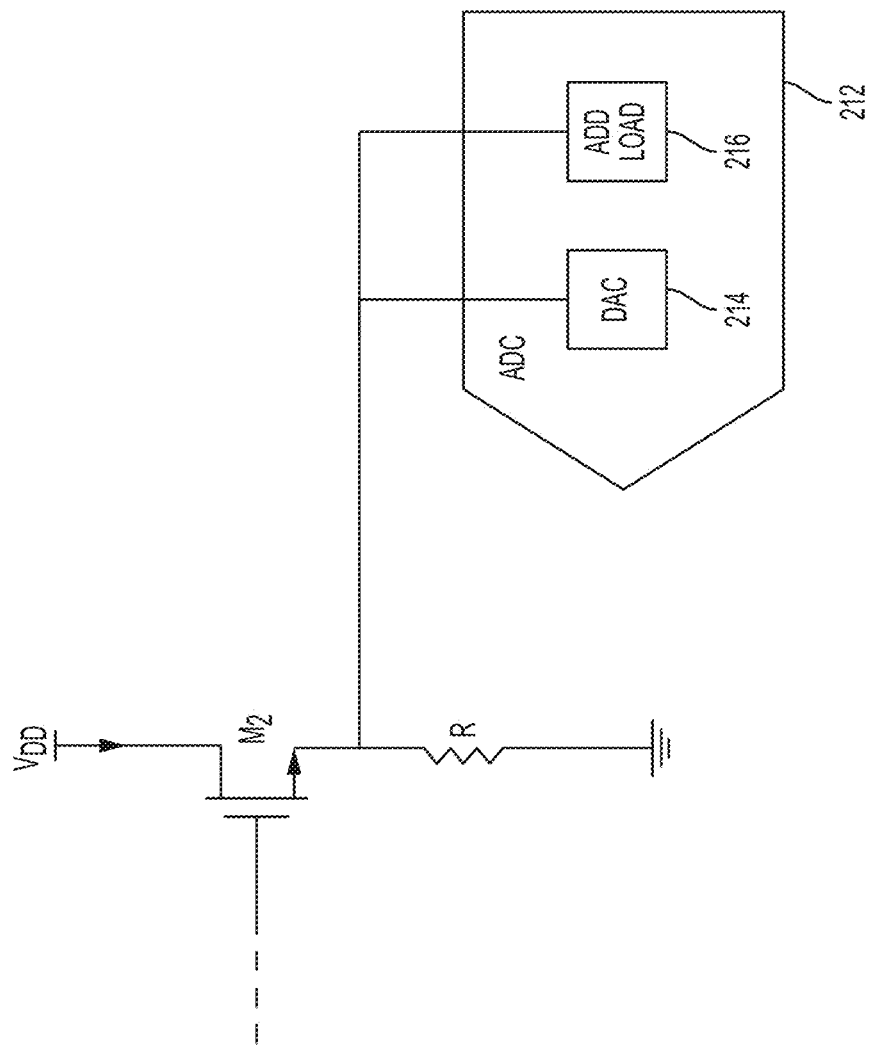
FIG. 2C is another circuit diagram of a circuit for current recycling used in connection with an ADC, according to some non-limiting embodiments.

In some embodiments, the additional load may be part of ADC 212. FIG. 2C is an exemplary implementation in which the additional load is part of ADC 212. In some embodiments, ADC 212 comprises a successive approximation (SAR) ADC. In these embodiments, the SAR ADC may be configured to perform a binary search until an error signal is minimized. The error signal may be obtained by comparing the input analog voltage with a signal generated with a digital-to-analog converter (DAC).

As illustrated in FIG. 2C, transistor $M_2$ may be configured to drive DAC 214 of SAR ADC 212 (or the DAC's driver). In some embodiments, a portion of the current provided by transistor $M_2$ may be directed to power additional load 216, thus reducing the current drawn by resistor R. Additional load 216 may comprise, for example, a signal amplifier, a pre-amplifier, or a class-A circuit. As in the case illustrated in FIG. 2B, the overall power consumption may be equal to that of the circuit of FIG. 1.

Figure 3A:
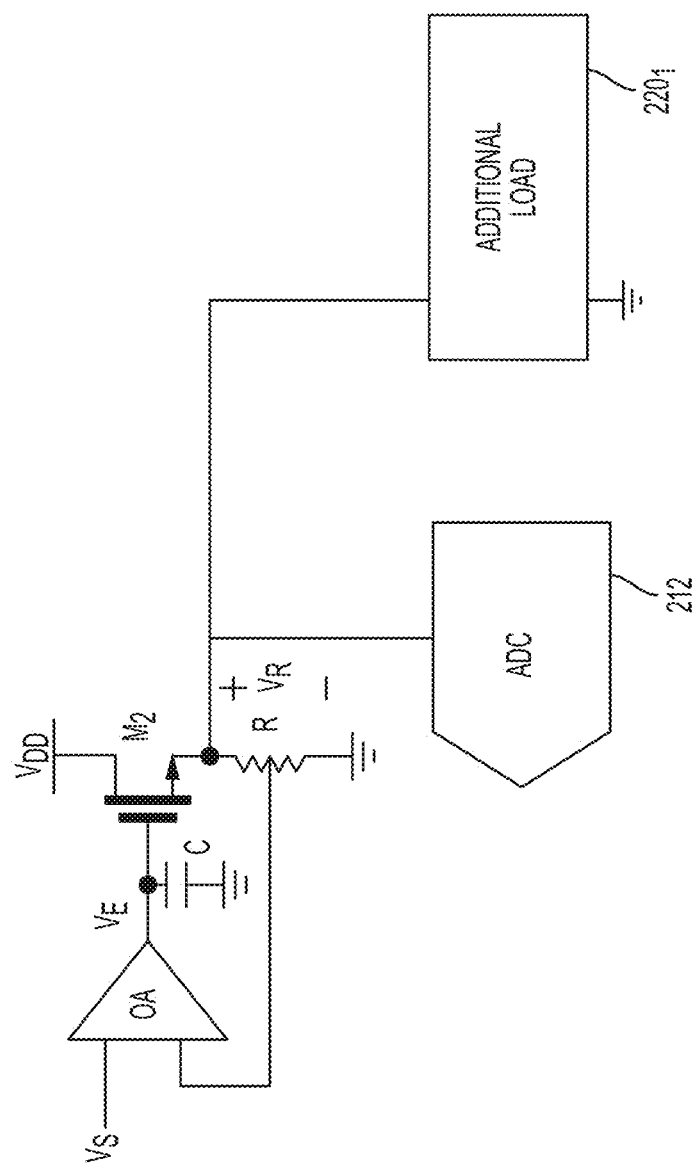
FIG. 3A is a circuit diagram of a circuit for current recycling comprising a feedback circuit, according to some non-limiting embodiments.

In some circumstances, the introduction of additional loads may affect the value of the reference voltage provided to the switched capacitor circuit or the ADC. For example, the additional load(s) may exhibit process, voltage and/or temperature (PVT) variations which may cause fluctuations or deviations in the reference voltage. In some embodiments, a signal buffer arranged in a closed-loop configuration may be used to attenuate such fluctuations. FIG. 3A illustrates one such configuration. As illustrated, a feedback circuit may be formed using transistor $M_2$, resistor R and operational amplifier OA. Operational amplifier OA may operate as a comparator. One input terminal of operational amplifier OA may receive a stable voltage $V_S$, and the second input terminal may receive a voltage that is proportional to voltage $V_R$. The operational amplifier and transistor $M_2$ may be capacitively coupled via capacitor C. When voltage $V_R$ fluctuates, for example due to process, voltage and/or temperature variations occurring in additional load $220_1$, these fluctuations may be sensed through the feedback circuit. Depending on the difference between the voltages appearing as inputs to operational amplifier OA, an error voltage $V_E$ may be generated. Error voltage $V_E$ may be provided to the gate terminal of transistor $M_2$, thus allowing transistor $M_2$ to counteract the fluctuations in the voltage provided as reference to ADC 212.

Figure 3B:
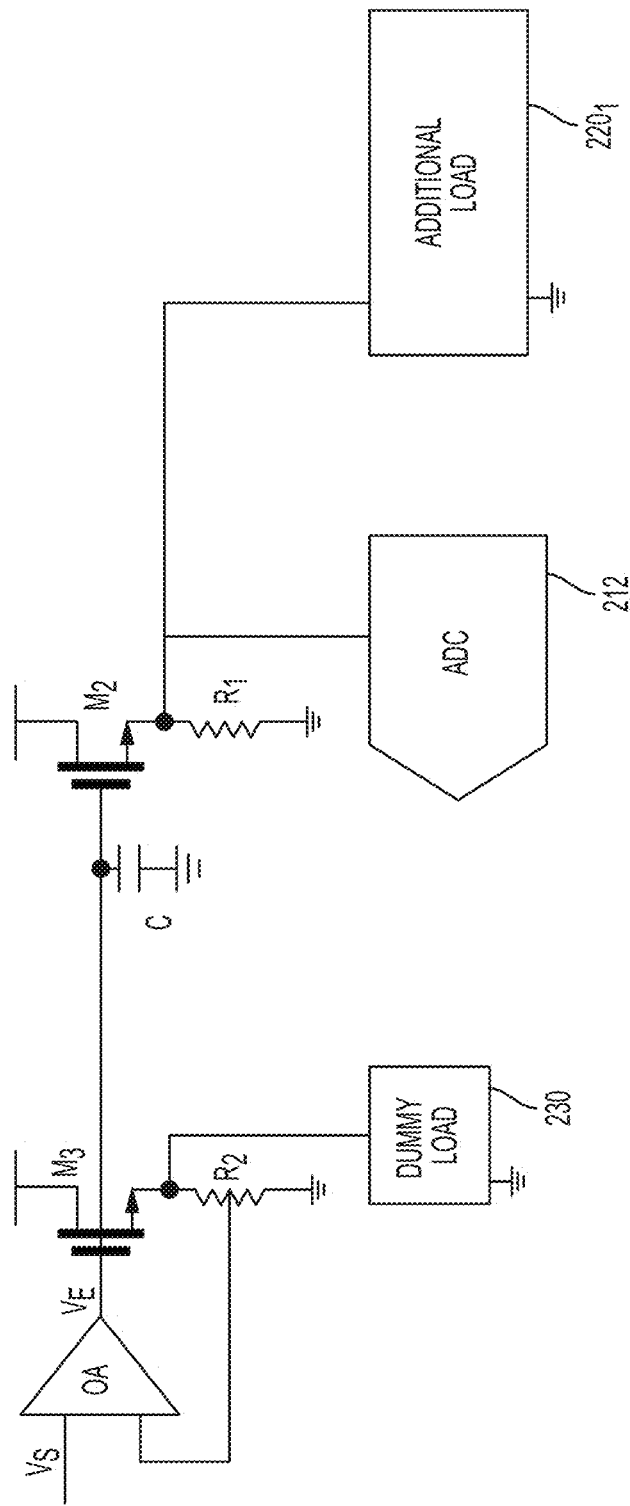
FIG. 3B is a circuit diagram of a circuit for current recycling comprising a dummy load, according to some non-limiting embodiments.

In some embodiments, one or more dummy loads (also referred to herein as "replica circuits") may be used to compensate for process, voltage and/or temperature variations in the additional loads. The dummy load may be configured to exhibit substantially the same process, voltage and/or temperature variations as the additional load. The variations in the dummy load may be fed into a feedback circuit, thus stabilizing the voltage provided as reference to ADC 212. One example of such a configuration is illustrated in FIG. 3B. In this configuration, a feedback circuit may be formed using operational amplifier OA, resistor $R_2$, and transistor $M_3$. Fluctuations occurring in the voltage across the terminals of resistor $R_2$, due to PVT variations in dummy load 230, may be sensed by the feedback circuit and may be compensated for via error voltage $V_E$. The error voltage $V_E$ may be fed to the gate terminals of transistors $M_2$ and $M_3$, thereby stabilizing the voltage across the terminals of resistors $R_1$ and $R_2$.

While FIGS. 3A-3B illustrate compensation circuits being used in connection with ADC 212, it should be appreciated that similar compensation circuits may be used in connection with switch capacitor circuits other than analog-to-digital converters.

In some circumstances, it may be desirable to temporarily increase the current provided to ADC 212. This may be the case, for example, during the conversion of the most significant bit (MSB) in the successive approximation algorithm. During the conversion of the MSB, because the switched capacitor circuit of ADC 212 (e.g., a DAC) may exhibit a large capacitance, the speed at which the converter operates may be low. However, the speed may be increased by providing additional current.

Figure 4:
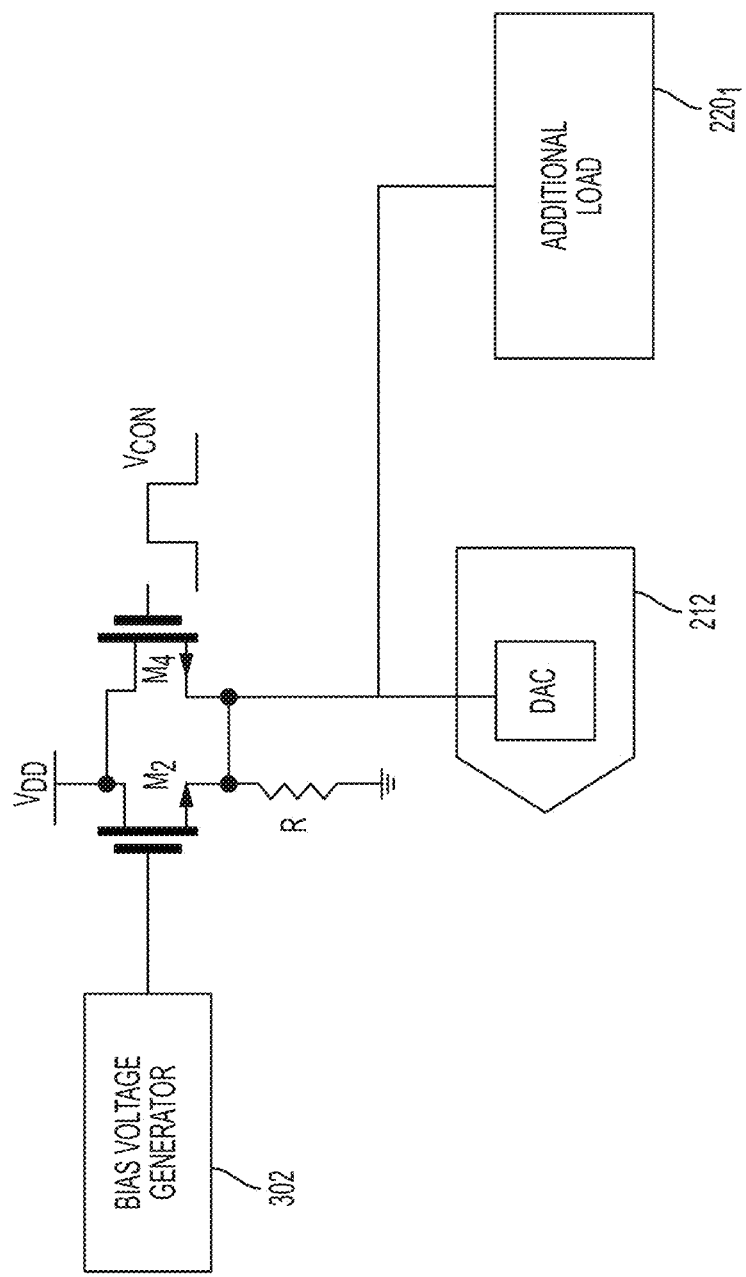
FIG. 4 is a circuit diagram of a circuit for current recycling comprising a plurality of signal buffers, according to some non-limiting embodiments.

In other circumstances, having a stable current may be more important than increasing the value of the current. This may be the case, for example, during the conversion of the least significant bit (LSB), when due to the small difference between the currently converted signal and the analog input signal, the converter is more susceptible to decision errors. In these circumstances, the current provided to the ADC may be reduced, thus also reducing the amplitude of any fluctuation that may occur in the current. An example of a circuit configured to vary the current provided to ADC 212 is illustrated in FIG. 4. In some embodiments, the circuit may include an additional signal buffer (e.g., transistor $M_4$). The additional signal buffer may be controlled using a control signal $V_{con}$. In some embodiments, transistor $M_2$, controlled by bias voltage generator 302, may be active throughout the conversion of an analog input signal, while transistor $M_4$ may be active only throughout portions of the conversion. For example, transistor $M_4$ may be activated during the conversion of the MSB (or the first few most significant bits), thus providing additional current to ADC 212, and may be deactivated thereafter. In this way, accuracy may be maintained during the conversion of the LSB. It should be appreciated that additional load $220_1$ may be powered by recycling part of the power absorbed by resistor R throughout the conversion of an analog input signal.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including", "comprising", "having", "containing" or "involving" and variations thereof herein, is meant to encompass the items listed thereafter and equivalents thereof as well as additional items.

The use of "coupled" or "connected" is meant to refer to circuit elements, or signals, that are either directly linked to one another or through intermediate components.

What is claimed is:

1. A circuit comprising:
   a switched capacitor circuit;
   a signal buffer configured to provide a reference signal to the switched capacitor circuit;
   a resistive impedance element coupled to the signal buffer and configured to receive a first current from the signal buffer; and
   an active circuit coupled to the signal buffer and configured to receive a second current from the signal buffer, the second current being configured to power, at least partially, the active circuit.

2. The circuit of claim 1, wherein the switched capacitor circuit is at least a portion of an analog-to-digital converter.

3. The circuit of claim 2, wherein the active circuit is at least a portion of the analog-to-digital converter.

4. The circuit of claim 2, wherein the analog-to-digital converter is a successive approximation analog-to-digital converter, and wherein the switched capacitor circuit is at least a portion of a digital-to-analog converter.

5. The circuit of claim 2, wherein the analog-to-digital converter is a successive approximation analog-to-digital converter, and wherein the active circuit comprises an amplifier configured to drive a digital-to-analog converter.

6. The circuit of claim 2, wherein the signal buffer is a first signal buffer, and further comprising a second signal buffer configured to drive the analog-to-digital converter during conversion of a most significant bit (MSB) and to be uncoupled from the analog-to-digital converter during conversion of a least significant bit (LSB).

7. The circuit of claim 1, further comprising feedback circuitry configured to counteract fluctuations in the reference signal.

8. The circuit of claim 7, further comprising a dummy load coupled to the feedback circuitry.

9. The circuit of claim 8, wherein the active circuit and the dummy load share equal process, voltage and/or temperature variations.

10. The circuit of claim 1, wherein the signal buffer is arranged in a source follower configuration.

11. The circuit of claim 1, wherein the signal buffer comprises an NMOS transistor.

12. The circuit of claim 11, wherein the resistive impedance element is coupled to a source terminal of the NMOS transistor.

13. The circuit of claim 11, wherein the switched capacitor circuit and the active circuit are coupled to a source terminal of the NMOS transistor.

14. The circuit of claim 1, wherein the active circuit comprises at least one transistor.

15. The circuit of claim 1, wherein the active circuit lacks power sources.

16. A method comprising:
   providing a reference signal to a switched capacitor circuit using a signal buffer; and
   providing a first current to a resistive impedance element coupled to the signal buffer and a second current to an active circuit coupled to the signal buffer, wherein the second current powers, at least partially, the active circuit.

17. The method of claim 16, wherein the switched capacitor circuit is at least a portion of an analog-to-digital converter.

18. The method of claim 17, wherein the active circuit is at least a portion of the analog-to-digital converter.

19. The method of claim 16, further comprising compensating for fluctuations in the reference signal using a feedback circuit coupled to the signal buffer.

20. The method of claim 16, further comprising compensating for process, voltage and/or temperature variations occurring in the active circuit by providing an error signal using a dummy load.

* * * * *